United States Patent [19]

Lozano

[11] Patent Number: 5,194,768
[45] Date of Patent: Mar. 16, 1993

[54] APPARATUS FOR FILTERING NOISE FROM A PERIODIC SIGNAL

[75] Inventor: Leo Lozano, Austin, Tex.

[73] Assignee: Advanced Micro Devices, Inc., Sunnyvale, Calif.

[21] Appl. No.: 858,892

[22] Filed: Mar. 27, 1992

[51] Int. Cl.$^5$ .................... H03K 17/16; H03K 17/687
[52] U.S. Cl. .................................. 307/520; 307/443; 307/573
[58] Field of Search ................. 307/272.1, 272.2, 520, 307/542, 443, 572, 570, 573

[56] References Cited

U.S. PATENT DOCUMENTS 4,874,971 10/1989 Fletcher ............................. 307/573
5,107,137 4/1992 Kinugasa et al. ................. 307/272.2

Primary Examiner—William L. Sikes
Assistant Examiner—Sinh Tran
Attorney, Agent, or Firm—Foley & Lardner

[57] ABSTRACT

An apparatus for filtering noise from a periodic signal defined by successive occurrences of a first deviation and a second deviation. The apparatus comprises a first delay circuit for imposing a predetermined delay period and a first gate circuit for controlling transmission of the signal, the first gate circuit being operatively connected with the first delay circuit and cooperating with the first delay circuit to delay one of the first deviation and second deviation by the delay period to produce a once-delayed signal. The apparatus further comprises a second delay circuit for imposing the predetermined delay period and a second gate circuit for controlling transmission of the once-delayed signal, the second gate circuit being operatively connected with the first gate circuit and with the second delay circuit and cooperating with the second delay circuit to delay the other of the first deviation and the second deviation by the delay period to produce a twice-delayed signal.

11 Claims, 2 Drawing Sheets

APPARATUS FOR FILTERING NOISE FROM A PERIODIC SIGNAL

BACKGROUND OF THE INVENTION

The present invention is directed to an apparatus for filtering noise from a periodic signal. In its preferred embodiment, the present invention is configured for filtering noise from an input clock signal for driving the system clock of an electronic circuit.

Earlier filter circuits for input clock signals typically employ Schmitt trigger devices. Schmitt trigger devices effect a filtering function by "ignoring" noise depending upon the amplitude of the noise. However, if the amplitude of noise exceeds, for example, one-half the swing of the clock signal being filtered, a Schmitt trigger will likely pass the signal as a true signal.

The present invention facilitates tailoring of where in a periodic signal noise is to be filtered, and such filtering is effected regardless of the amplitude of the noise. The present invention effectively "stretches" a positive pulse and a negative pulse of a clock signal to "ignore" noise occurring during a predetermined time period so that no spurious triggering of the filter circuit to pass the clock signal is possible, regardless of how noisy the signal may be (i.e., regardless of how great the amplitude of the noise).

SUMMARY OF THE INVENTION

The invention is an apparatus for filtering noise from a periodic signal, which signal effects a first deviation from a first signal level to a second signal level at a first time, and effects a second deviation from the second signal level to the first signal level at a second time. The signal is defined by successive occurrences of the first deviation and the second deviation. The apparatus comprises a first delay circuit for imposing a predetermined delay period and a first gate circuit for controlling transmission of the signal, the first gate circuit being operatively connected with the first delay circuit and cooperating with the first delay circuit to delay one of the first deviation and second deviation by the delay period to produce a once-delayed signal. The apparatus further comprises a second delay circuit for imposing the predetermined delay period and a second gate circuit for controlling transmission of the once-delayed signal, the second gate circuit being operatively connected with the first gate circuit and with the second delay circuit and cooperating with the second delay circuit to delay the other of the first deviation and the second deviation by the delay period to produce a twice-delayed signal.

In its preferred embodiment, the first delay circuit receives the signal and generates a first delay control signal; the first gate circuit is responsive to the first delay control signal for gating the signal appropriately to generate the once-delayed signal. The once-delayed signal is received by the second delay circuit and the second gate circuit. The second delay circuit generates a second delay control signal which controls the second gate circuit in its gating of the once-delayed signal to produce a twice-delayed signal. The twice-delayed signal has the same period as the original signal and is delayed with respect to the original signal by a time period equal to or less than the delay period imposed by each of the first delay circuit and the second delay circuit.

It is therefore an advantage of the present invention to provide an apparatus for filtering noise from a periodic signal which precludes the possibility of spurious generation of an output signal because of high amplitude noise.

A further object of the present invention is to provide an apparatus for filtering noise from a periodic signal which facilitates a tailoring of choice of the portion of the signal to be filtered.

Further objects and features of the present invention will be apparent from the following specification and claims when considered in connection with the accompanying drawings illustrating the preferred embodiment of the invention.

DETAILED DESCRIPTION OF THE INVENTION

Figure 1:
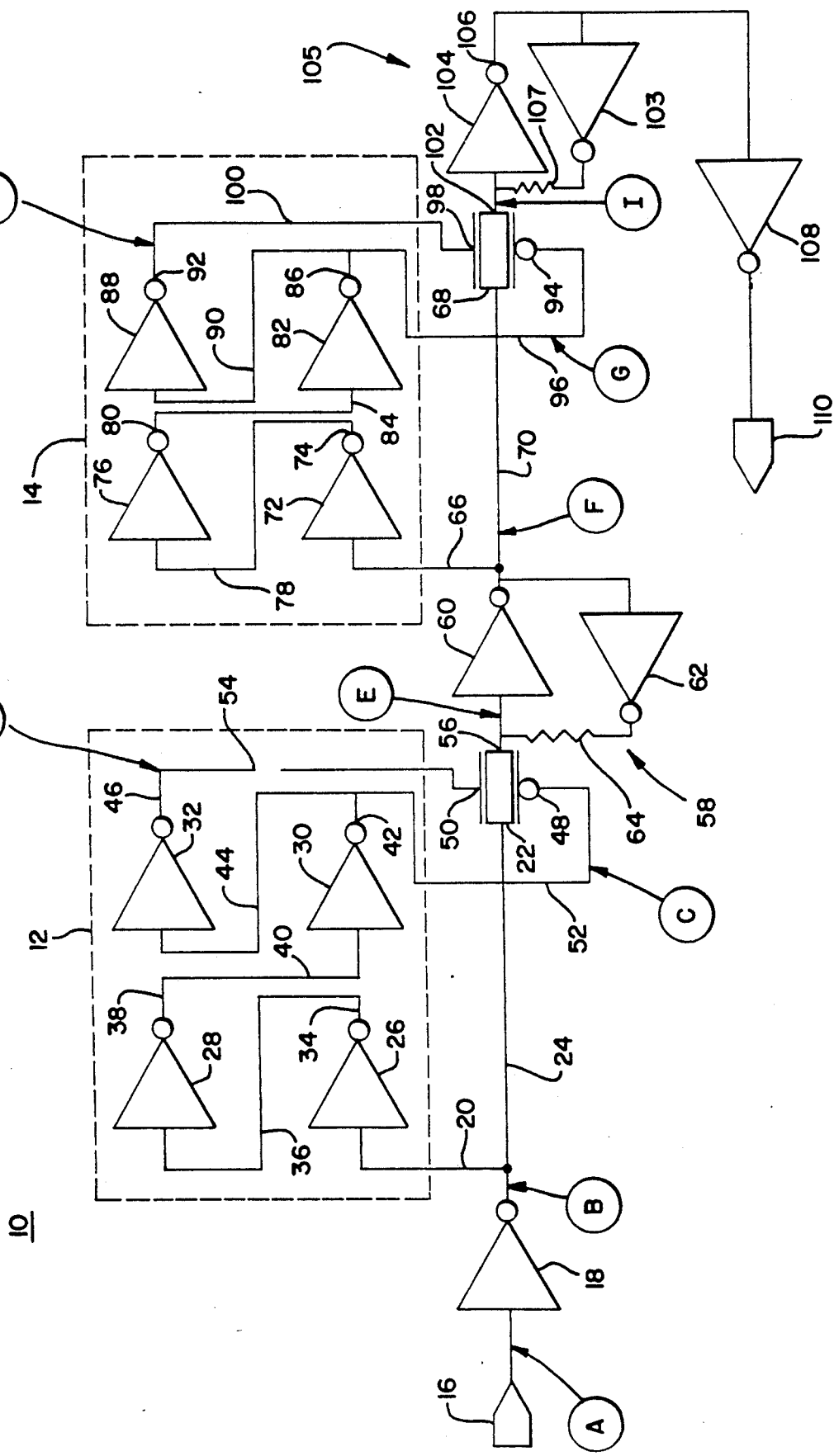
FIG. 1 is a schematic diagram of the preferred embodiment of the present invention.

FIG. 1 is a schematic diagram of the preferred embodiment of the present invention. In FIG. 1, a filter apparatus 10 is illustrated including a first delay circuit 12 and a second delay circuit 14. Apparatus 10 receives an input signal at an input terminal 16; the input signal is received by an inverter 18 and an inverted representation of the input signal received at input terminal 16 is provided to first delay circuit 12 via a line 20, and to a gating element 22 via a line 24. First delay circuit 12 is preferably comprised of a plurality of inverters 26, 28, 30, 32. Inverter 26 receives the inverted representation of the input signal via line 20 and generates an inverted version of the signal received via line 20, delayed by a predetermined first delay interval, at an output 34. Inverter 28 receives the signal generated by inverter 26 via a line 36 and generates an inverted representation of the signal received via line 36 at an output 38, delayed by a predetermined second delay interval. Inverter 30 receives the signal generated by inverter 28 via a line 40 and generates an inverted representation of the signal received via line 40 at an output 42, delayed by a predetermined third delay interval. Inverter 32 receives the output generated by inverter 30 via a line 44 and generates an inverted representation of the signal received via line 44 at an output 46, delayed by a predetermined fourth delay interval. Gating element 22 is preferably a CMOS transfer gate which presents a p-channel field effect transistor (FET) gate 48 and an n-channel FET gate 50. P-channel FET gate 48 is connected with output 42 of inverter 30 via a line 52, and n-channel FET gate 50 is connected with output 46 of inverter 32 via a line 54.

As will be recognized by one skilled in the art, gating element 22 is controlled by signals provided via lines 52, 54 to p-channel FET gate 48 and n-channel FET gate 50, respectively. That is, so long as either the signal provided to the p-channel FET gate 48 via line 52 is "LOW" or the signal provided to n-channel FET gate 50 via line 54 is "HIGH", then gating element 22 will transmit whatever signal is received via line 24. Upon the cessation of a transmission condition (i.e., neither the signal on line 52 is LOW nor the signal on line 54 is HIGH), gating element 22 will maintain at an output 56 the value last transmitted by gating element 22.

Preferably, the first delay interval imposed by inverter 26, the second delay interval imposed by inverter 28, the third delay interval imposed by inverter 30, and the fourth delay interval imposed by inverter 32 are all equal. In any event, those various delay intervals additively contribute to a delay period imposed upon the signal received by first delay circuit 12 via line 20, effectively "stretching" LOW signals received by gating element 22 via line 24.

The signal output of gating element 22 at output 56 is, therefore, a once-delayed signal representative of the input signal received at input terminal 16 with the delay period imposed by first delay circuit 12 reflected in a lengthening of the LOW portion of the periodic signal received via line 24 by the amount of the delay period established by first delay circuit 12.

The once-delayed signal generated at output 56 of gating element 22 is received by a latching assembly 58 comprised of an inverter 60, an inverter 62, and a resistive element 64. Inverter 62 and resistive element 64 are unnecessary when the input signal received at input terminal 16 is a periodic clocking signal having a sufficiently high frequency. That is, latching assembly 58 is intended to latch the once-delayed signal received from output 56 of gating element 22 at the level present when gating element 22 is turned off (i.e., ceases transmitting the signal it receives via line 24). When the signal presented at input terminal 16 is a periodic clocking signal of an appropriate frequency, then the signal supplied via line 24 to gating element 22 periodically refreshes itself frequently so that gating element 22 can maintain the level of the once-delayed signal at output 56 sufficiently well for the short time which elapses until the signal is reset.

Inverter 60 receives the once-delayed signal from output 56 of gating element 22, generates an inverted representation of the once-delayed signal, and provides that inverted representation to second delay circuit 14 via a line 66. The inverted representation is also provided to a gating element 68 via a line 70. The signal provided on lines 66, 70 is in-phase with the input signal received at input terminal 16. In second delay circuit 14, an inverter 72 generates an inverted representation of the signal received via line 66, delayed by a first predetermined delay interval, at an output 74. An inverter 76 receives the signal generated at output 74 of inverter 72 via a line 78 and generates an inverted representation of the signal received via line 78, delayed by a second predetermined delay interval, at an output 80. An inverter 82 receives the signal generated at output 80 of inverter 76 via a line 84 and generates an inverted representation of the signal received via line 84, delayed by a third predetermined delay interval, at an output 86. An inverter 88 receives the signal generated at output 86 of inverter 82 via a line 90 and generates an inverted representation of the signal received via line 90, delayed by a fourth predetermined delay interval, at an output 92.

The signal generated at output 86 of inverter 82 is provided to a p-channel FET gate 94 of gating element 68 via a line 96; the signal generated at output 92 of inverter 88 is provided to an n-channel FET gate 98 of gating element 68 via a line 100.

In the preferred embodiment of the present invention, the first, second, third, and fourth delay intervals imposed by inverters 72, 76, 82, 88, respectively, are equal and each contributes to the delay period imposed by second delay circuit 14.

Gating element 68 is preferably a CMOS transfer gate similar to gating element 22 and, therefore, transmits signals received via line 70 whenever either the signal on line 96 is LOW or the signal on line 100 is HIGH. Gating element 68 latches the signal at an output 102 at the last signal level transmitted through gating element 68 when gating element 68 ceases transmitting (i.e., is switched off). Signals appearing at output 102 of gating element 68 are twice-delayed signals and are received by a latching assembly 105 comprised of an inverter 103, a resistive element 107, and an inverter 104. Inverter 103 and resistive element 107 are unnecessary when the input signal received at input terminal 16 is a clocking signal having a sufficiently high frequency, just as explained above in connection with latching assembly 58.

Inverter 18 and inverter 104 each primarily performs a buffer function intermediate apparatus 10 and other electronic circuitry with which apparatus 10 may be employed (not shown). Any buffering device may be employed in place of inverters 18, 104, but present-day CMOS technology provides easier manufacture of inverters than many other types of buffering devices which could be employed.

As a consequence of employing inverter 104 for buffering apparatus 10, signals appearing at an output 106 of inverter 104 are inverted representations of input signals received at input terminal 16. Consequently, signals appearing at output 106 of inverter 104 may be applied to an inverter 108 to provide a signal output at an output terminal 110 which is in-phase with the input signal received at input terminal 16.

By choosing the various delay intervals imposed upon signals by inverters 26, 28, 30, 32 of first delay circuit 12 and by inverters 72, 76, 82, 88 of second delay circuit 14, one may establish which portion of the input signal received at input terminal 16 is to be "stretched" to effect filtering.

Figure 2:
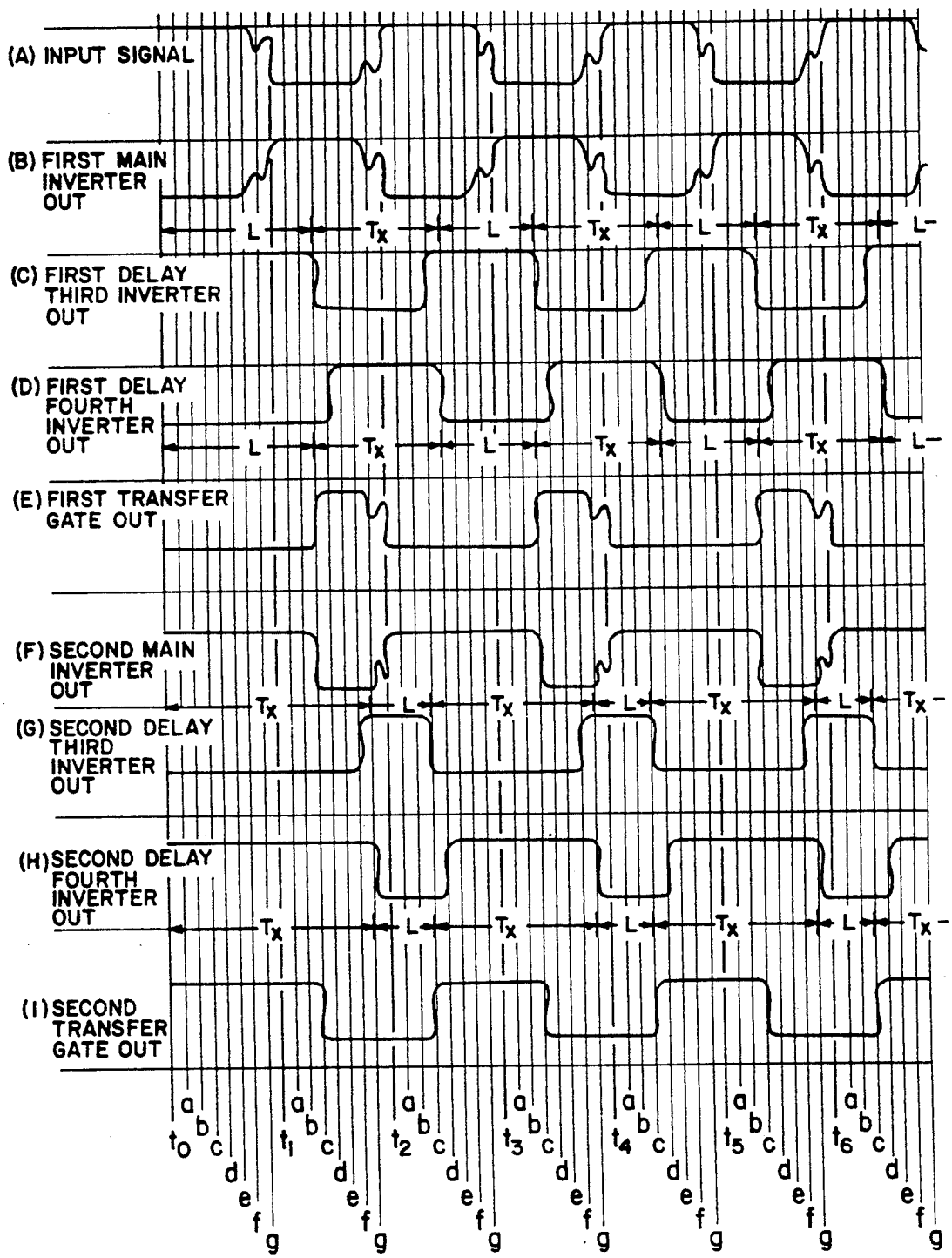
FIG. 2 illustrates a variety of signals at various points within the apparatus illustrated in FIG. 1.

FIG. 2 illustrates a variety of signals at various points within the apparatus illustrated in FIG. 1. In FIG. 2, letter designations for respective wave forms are keyed to letter designations appearing in FIG. 1.

Thus, input signal A (FIG. 2) is received at input terminal 16 (FIG. 1) and varies between a first (upper) level (HIGH) and a second (lower) level (LOW), making transitions from HIGH to LOW at times $t_1$, $t_3$, and $t_5$. Noise accompanies transitions from HIGH to LOW at times $t_1$, $t_3$, $t_5$. Noise also accompanies transitions from LOW to HIGH at times $t_2$, $t_4$, $t_6$.

Input signal A is applied to inverter 18, and the first main inverter out signal B is generated and presented at lines 20, 24. First main inverter 18, of course, imposes some delay on signals as it transmits them and inverts them. However, for simplicity of explanation and for clarity of illustration of the operation of the present invention, the delay intervals imposed by inverters other than those involved in first delay circuit 12 and second delay circuit 14 are ignored in this description. Thus, first main inverter out signal B is an inverted representation of input signal A.

One skilled in the art will recognize that the first delay third inverter out signal C (i.e., the signal appearing at output 42 of inverter 30 in FIG. 1) is in-phase with input signal A. Again, for simplicity of explanation and illustration, although some noise may attend transitions between levels by the time the input signal A is transmitted to third inverter 30, the effects of those noise spikes are minimal and are ignored in this description.

Thus, first delay third inverter 30 out signal C is seen to be in-phase with input signal A, but three delay intervals later than first main inverter out signal B. That is, first main inverter out signal B shifts from LOW to HIGH at time $t_1$, but first delay third inverter out signal C does not make its corresponding inverted transition from HIGH to LOW until time $t_{1,c}$. This is because a first delay interval imposed by inverter 26 effects transitions of signals at output 34 at time $t_{1,a}$; second inverter 28 imposes a second delay interval on signals received on line 36 so that signals at output 38 of inverter 28 effect transition of signals at time $t_{1,b}$; and third inverter 30 imposes a third delay interval on signals received via line 40 so that corresponding transitions of output 42 of inverter 30 occur at time $t_{1,c}$. Signals appearing at output 46 of fourth inverter 32 are represented by first delay fourth inverter out signal D in FIG. 2, and effect transition from LOW to HIGH at time $t_{1,d}$.

First delay third inverter out signal C is applied to p-channel FET gate 48 of gating element 22 via line 52. First delay fourth inverter out signal D is applied to n-channel FET gate 50 of gating element 22 via line 54. Gating element 22 transmits signals received via line 24 so long as either first delay third inverter out signal C is LOW or first delay fourth inverter out signal D is HIGH. Accordingly, gating element 22 will transmit during the interval labelled $T_x$ (below the wave form representing first delay fourth inverter out signal D, and reproduced below the wave form representing first main inverter out signal B).

First transfer gate out signal E is a once-delayed signal which is latched LOW until time $t_{1,c}$, then follows first main inverter out signal B until time $t_{2,d}$, then is latched LOW until time $t_{3,c}$, and so on as indicated in FIG. 2. Consequently, first transfer gate out signal E (appearing at output 56 of gating element 22) is out-of-phase with input signal A, with its LOW pulse "stretched" by three time intervals and with its transition from HIGH to LOW occurring concurrently with input signal A transitions from LOW to HIGH.

Second main inverter out signal F (appearing at lines 66, 70 in FIG. 1) is an inverted representation of first transfer gate out signal E. Second delay third inverter out signal G (appearing at output 86 of inverter 82 of second delay circuit 14 in FIG. 1) is in-phase with first transfer gate out signal E and delayed three time intervals with respect to second main inverter out signal F. Second delay fourth inverter out signal H (appearing at output 92 of inverter 88 in FIG. 1) is an inverted representation of second delay third inverter out signal G and is delayed one time interval with respect to second delay third inverter out signal G.

Gating element 68 is in a transmit mode whenever either second delay third inverter out signal G (appearing on line 96 in FIG. 1) is Low, or second delay fourth inverter out signal H (appearing on line 100 in FIG. 1) is HIGH. Thus, gating element 68 is in a transmit mode as indicated by the annotation $T_x$ (below the wave form representing second delay fourth inverter out signal H and reproduced below the wave form representing second main inverter out signal F). Second transfer gate out signal I (appearing at output 102 of gating element 68 in FIG. 1) follows second main inverter out signal F until time $t_{1,g}$, at which point output 102 of gating element 68 is latched (indicated by the annotation "L") at the then-existing output level present at output 102 of gating element 68 until time $t_{2,c}$. At time $t_{2,c}$ second main inverter out signal F is HIGH so that second transfer gate out signal I shifts to a HIGH level. Thereafter, second transfer gate out signal I follows second main inverter out signal F until time $t_{3,g}$, at which time output 102 of gating element 68 is latched LOW until time $T_{4,c}$ when gating element 68 again enters a transmit mode and second transfer gate out signal I again follows second main inverter out signal F and shifts to a HIGH level, and so on as indicated in FIG. 2. The resulting signal at output 102 of gating element 68 is a twice-delayed signal having the same duty cycle and same period as input signal A. In the example illustrated in FIG. 2, second transfer gate out signal I is delayed with respect to input signal A by three time intervals. The noise attending transitions by input signal A from HIGH to LOW are filtered out by latching first transfer gate out signal E at the level which existed in first main inverter out signal B prior to the time the noise spike occurred in input signal A when it varied from HIGH to LOW. Similarly, noise spikes occurring when input signal A varied from LOW to HIGH are filtered out by latching second transfer gate out signal I at the level which existed in second main inverter out signal F prior to the time the noise spike occurred in input signal A when it varied from LOW to HIGH.

It is to be understood that, while the detailed drawing and specific examples given describe preferred embodiments of the invention, they are for the purpose of illustration, that the apparatus of the invention is not limited to the precise details and conditions disclosed and that various changes may be made therein without departing from the spirit of the invention which is defined by the following claims:

What is claimed is:

1. An apparatus for filtering noise from a periodic signal, said signal effecting a first deviation from a first signal level to a second signal level at a first time, and effecting a second deviation from aid second signal level to said first signal level at a second time; successive occurrences of said first deviation and said second deviation defining a signal period; the apparatus comprising:

a first delay means or imposing a predetermined delay period;

a first gate means for controlling transmission of said signal; said first gate means being operatively connected with said first delay means and cooperating with said first delay means to delay one of said first deviation and said second deviation by said delay period to produce a once-delayed signal;

a second delay means for imposing said predetermined delay; and a second gate means for controlling transmission of said once-delayed signal; said second gate means being operatively connected with said first gate means and with said second delay means and cooperating with said second delay means to delay the other of said first deviation and said second deviation by said delay period to produce a twice-delayed signal;

said first delay means being operatively connected to receive said signal and said cooperation between said first delay means and said first gate means being effected by a first delay control signal generated by said first delay means; said first gate means being responsive to said first delay control signal; said first delay control signal being a derivative of said signal.

2. An apparatus for filtering noise from a periodic signal as recited in claim 1 wherein said first delay means is operatively connected to receive said signal and said cooperation between said first delay means and said first gate means is effected by a first delay control signal generated by said first delay means; said first gate mans being responsive to said first delay control signal; said first delay control signal being a derivative of said signal.

3. An apparatus for filtering noise from a periodic signal as recited in claim 1 wherein said second delay means is operatively connected to receive said once-delayed signal and said cooperation between said second delay means and said second gate means is effected by a second delay control signal generated by said second delay means; said second gate means being responsive to said second delay control signal; said second delay control signal being a derivative of said once-delayed signal.

4. An apparatus for filtering noise from a periodic signal as recited in claim 3 wherein the apparatus further comprises an input means for receiving said signal; an output means for outputting said twice-delayed signal; and a plurality of buffering devices; a first buffering device of said plurality of buffering devices being operatively connected to receive said signal from said input means and to transmit said signal to said first delay means and to said first gate means; a second buffering device of said plurality of buffering devices being operatively connected to receive said once-delayed signal from said first gate means and to transmit said once-delayed signal to said second delay means and to said second gate means; a third buffering device of said plurality of buffering devices being operatively connected to receive said twice-delayed signal from said second gate means and to transmit said twice-delayed signal to said output means.

5. An apparatus for filtering noise from a periodic signal as recited in claim 4 wherein said second buffering device comprises a latch device.

6. An apparatus for filtering noise from a periodic signal as recited in claim 4 wherein said first buffering device, said second buffering device, and said third buffering device each comprises an inverter.

7. An apparatus for filtering noise from a periodic signal as recited in claim 3 wherein said first delay means comprises a first plurality of series-connected inverters and said second delay means comprises a second plurality of series-connected inverters.

8. An apparatus for filtering noise from a periodic signal as recited in claim 7 wherein said first gate means comprises a first CMOS transfer gate and said second gate means comprises a second CMOS transfer gate; said first delay control signal comprising an output from the penultimate inverter of said first plurality of series-connected inverters and an output from the final inverter of said first plurality of series-connected inverters; said second delay control signal comprising an output from the penultimate inverter of said second plurality of series-connected inverters and an output from the final inverter of said second plurality of series-connected inverters.

9. An apparatus for filtering noise from a periodic signal as recited in claim 8 wherein the apparatus further comprises an input means or receiving said signal; an output means for outputting said twice-delayed signal; and a plurality of buffering devices; a first buffering device of said plurality of buffering devices being operatively connected to receive said signal from said input means and to transmit said signal to said first delay means and to said first gate means; a second buffering device of said plurality of buffering devices being operatively connected o receive said once-delayed signal from said first gate means and to transmit said once-delayed signal to said second delay means and to said second gate means; a third buffering device of said plurality of buffering devices being operatively connected to receive said twice-delayed signal from aid second gage means and to transmit said twice-delayed signal to said output means.

10. An apparatus for filtering noise from a periodic signal as recited in claim 9 wherein said second buffering device comprises a latch device.

11. An apparatus for filtering noise from a periodic signal as recited in claim 9 wherein said first buffering device, said second buffering device, and said third buffering device each comprises an inverter.

* * * * *